(12) United States Patent
Wei et al.

(10) Patent No.: US 7,115,182 B2
(45) Date of Patent: Oct. 3, 2006

(54) ANODIC BONDING PROCESS FOR CERAMICS

(75) Inventors: Jun Wei, Singapore (SG); Stephen Chee Khuen Wong, Singapore (SG); Sharon Mui Ling Nai, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/868,714

(22) Filed: Jun. 15, 2004

(65) Prior Publication Data

US 2006/0191629 A1 Aug. 31, 2006

(51) Int. Cl.
*B32B 37/06* (2006.01)
*B32B 38/00* (2006.01)
*C04B 37/00* (2006.01)

(52) U.S. Cl. .................. 156/272.2; 156/89.11; 156/153; 156/273.9; 156/274.4; 156/281

(58) Field of Classification Search ............ 156/89.11, 156/153, 281, 272.2, 273.1, 273.9, 274.4
See application file for complete search history.

(56) References Cited

U.S. PATENT DOCUMENTS

| | | | | |
|---|---|---|---|---|
| 3,397,278 A | * | 8/1968 | Pomerantz | 257/650 |
| 3,417,459 A | * | 12/1968 | Pomerantz et al. | 156/273.1 |
| 3,967,296 A | * | 6/1976 | Intrator | 257/778 |
| 4,452,624 A | | 6/1984 | Wohltjen et al. | 65/40 |
| 4,643,532 A | * | 2/1987 | Kleiman | 349/190 |
| 4,773,972 A | * | 9/1988 | Mikkor | 156/89.15 |
| 5,009,690 A | * | 4/1991 | Curlee et al. | 65/40 |
| 5,141,148 A | * | 8/1992 | Ichiyawa | 228/121 |
| 5,280,648 A | * | 1/1994 | Dobrovolny | 455/326 |
| 5,695,590 A | | 12/1997 | Willcox et al. | 156/272.2 |
| 5,747,169 A | * | 5/1998 | Fan et al. | 428/426 |
| 5,769,997 A | | 6/1998 | Akaike et al. | 156/273.1 |
| 5,938,911 A | * | 8/1999 | Quenzer et al. | 205/114 |
| 5,989,372 A | * | 11/1999 | Momoda et al. | 156/89.11 |
| 6,086,188 A | * | 7/2000 | Ishida et al. | 347/70 |
| 6,197,139 B1 | * | 3/2001 | Ju et al. | 156/99 |
| 6,368,942 B1 | * | 4/2002 | Cardinale | 438/459 |
| 6,417,478 B1 | * | 7/2002 | Shiraishi et al. | 219/78.02 |
| 6,606,772 B1 | * | 8/2003 | Nohara et al. | 29/25.35 |

(Continued)

FOREIGN PATENT DOCUMENTS

DE 44 46 704 * 4/1996

(Continued)

OTHER PUBLICATIONS

Byeong-Kwon Ju et al., "Glass-to-glass electrostatic bonding for FED tubeless packaging application," Microelectronics Journal, vol. 29, pp. 839-844 (1998).*

(Continued)

*Primary Examiner*—Melvin Mayes
(74) *Attorney, Agent, or Firm*—Saile Ackerman LLC; Stephen B. Ackerman; Stephen G. Stanton

(57) ABSTRACT

A method of bonding components comprising the following steps. At least a first ceramic component and a second ceramic component are provided. A first conductive layer is formed over the upper surface of the first ceramic component. An intermediate film is formed over the first conductive layer. A second conductive layer is formed over the lower surface of the second ceramic component. The second ceramic component is stacked over the first ceramic component wherein the second conductive layer on the second ceramic component opposes the intermediate film on the first component. The first and second ceramic components are anodically bonded together.

90 Claims, 2 Drawing Sheets

U.S. PATENT DOCUMENTS

| | | | |
|---|---|---|---|
| 6,617,264 B1 * | 9/2003 | Hsiao et al. | 438/780 |
| 6,660,614 B1 * | 12/2003 | Hirschfeld et al. | 438/455 |
| 6,814,833 B1 * | 11/2004 | Sabia | 156/281 |
| 2001/0021570 A1 * | 9/2001 | Lin et al. | 438/455 |
| 2002/0130408 A1 * | 9/2002 | Pike et al. | 257/714 |
| 2003/0037871 A1 * | 2/2003 | Gross | 156/274.8 |
| 2004/0029336 A1 * | 2/2004 | Harpster et al. | 438/202 |
| 2005/0072189 A1 * | 4/2005 | Tudryn et al. | 65/36 |
| 2005/0077633 A1 * | 4/2005 | Ko et al. | 257/782 |
| 2005/0132750 A1 * | 6/2005 | Elp | 65/40 |

FOREIGN PATENT DOCUMENTS

| | | | |
|---|---|---|---|
| DE | 196 03 023 | * | 7/1996 |
| DE | 195 45 422 | * | 6/1997 |
| EP | 0317445 | | 11/1988 |
| EP | 0619598 | | 3/1994 |
| JP | 6-287082 | * | 10/1994 |
| JP | 2002-145676 | * | 5/2002 |
| JP | 2003-192398 | * | 7/2003 |
| JP | 2003-238202 | * | 8/2003 |
| WO | WO 03/097552 | | 11/2003 |

OTHER PUBLICATIONS

Duck-Jung Lee et al., "Glass-to-glass anodic bonding for high vacuum packaging of microelectronics and its stability," Micro Electro Mechanical Systems, 2000, MEMS 2000. The Thirteenth Annual International Conference on, pp. 253-258 (Jan. 2000).*

A. Berthold et al., "Glass-to-glass anodic bonding with standard IC technology thin films as intermediate layers," Sensors and Actuators, vol. 82, pp. 224-228 (May 2000).*

Tanaka et al., "Anodic bonding of lead zirconate titanate ceramics to silicon with intermediate glass layer," Sensors and Actuators, vol. 69, pp. 199-203 (1998).*

Anders Hanneborg et al., "Silicon-to-thin anodic bonding," J. Micromech. Microeng., vol. 2, pp. 117-121 (1992).*

Jun Wei et al., "Low temperature glass-to-glass wafer bonding," IEEE Transactioons On Advanced Packaging, vol. 26, No. 3, pp. 289-294 (Aug. 2003).*

* cited by examiner

ANODIC BONDING PROCESS FOR CERAMICS

FIELD OF THE INVENTION

The present invention relates generally to bonding and more specifically to the bonding of ceramic components.

BACKGROUND OF THE INVENTION

Ceramics range from diverse silicates to oxides of Al, Ti, Zr, Be, etc. Ceramics also include non-oxides such as carbides, nitrides and borides of the transition elements plus multiphase composites which may be totally or partially ceramic.

Ceramics may be used as electrical insulators, semiconductors, conductors or superconductors and may display large piezoelectric effect, have voltage-sensitive resistance or may have their electrical permittivity change with humidity. They may be good heat conductors or excellent thermal insulators and can be used at high operating temperatures intolerable by many metals and super alloys. Broadly speaking, the permissible operating temperature of ceramics is between about 0.5 to 0.7 Tm where Tm is the ceramic's melting point.

Although the synthesis of ceramic materials for high performance and high reliability is advancing tremendously, their commercialization is lagging due to poor integration techniques. While scientific and engineering efforts have been focused upon ceramic-metal joining/bonding, ceramic—ceramic bonding is not, as of yet, as well developed.

U.S. Pat. No. 5,769,997 to Akaike et al. and European Patent Specification 0619598 A3 0619598 to Akaike et al. both describe anodic bonding of an insulator containing no movable ion and a conductor through the medium of a conductive film and an insulator layer containing movable ions.

U.S. Pat. No. 5,695,590 to Willcox et al. describes anodic bonding to fabricate a pressure sensor.

U.S. Pat. No. 4,452,624 to Wohltjen describes a method for making an airtight seal between a pair of glass plates.

European Patent Specification 0317445 to Gotou describes bonding of a first silicon substrate coated with silicon oxide to a second silicon substrate coated with beta-SiC and/or phosphosilicate glass layer.

SUMMARY OF THE INVENTION

Accordingly, it is an object of one or more embodiments of the present invention to provide a method of anodically bonding ceramic components at low temperatures.

Other objects will appear hereinafter.

It has now been discovered that the above and other objects of the present invention may be accomplished in the following manner. Specifically, at least a first ceramic component and a second ceramic components are provided. Each of the at least first and second ceramic components having an upper and lower surface. A first conductive layer is formed over the upper surface of the first ceramic component. An intermediate film is formed over the first conductive layer. A second conductive layer is formed over the lower surface of the second ceramic component. The second ceramic component is stacked over the first ceramic component wherein the second conductive layer on the second ceramic component opposes the intermediate film on the first component. The first and second ceramic components are anodically bonded together.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Information Known to the Inventors—Not to be Considered as Prior Art

The following information is known to the inventors and is not to be considered as prior art for the purposes of this invention.

The available bonding techniques for ceramic—ceramic bonding are: (1) diffusion bonding; (2) metallic brazing; and (3) glass intermediate layer bonding.

Diffusion Bonding

In diffusion bonding, the ceramics must be heated up to about 0.6 to 0.8 Tm which is an extremely high bonding temperature. Diffusion bonding is a solid phase process achieved via atomic migration with no macrodeformation of the components. Initial surface flatness and cleanliness are essential. Surface roughness values of less than 0.4 microns are required and the samples must be cleaned prior to bonding. Typically the process variables range from several hours at moderate temperatures ($0.6\,T_m$) to minutes at higher temperatures ($0.8\,T_m$), with applied pressure.

Metallic Brazing and Glass Intermediate Layer Bonding

Metallic brazing and glass intermediate layer bonding were developed to achieve lower temperature bonding, i.e. from about 400 to 700° C. In these two respective methods, the brazing element and the glass intermediate layer need to be melted during the bonding process. Thus, the applicable operating temperature of the integrated ceramic systems will be limited by the melting point of the intermediate layers.

Problems Known to the Inventors—Not to be Considered Prior Art

The following are problems known to the inventors and are not to be considered as prior art for the purposes of the present invention.

In state-of-the-art ceramic bonding techniques, the components are bonded at high temperatures, i.e from about 0.6 to 0.8 Tm or from about 400 to 700° C. At these high bonding temperatures, there are some inherent problems such as: residual stresses after bonding due to the difference of thermal expansion coefficient between components; and the components are susceptible to damage during the high temperature bonding process and this limits the range of materials to be bonded.

Present Invention

The present invention provides a method of anodically bonding ceramic components at low temperatures, i.e. preferably from about 100 to 400° C. and more preferably from about 300 to 200° C. or lower.

For the purposes of this invention, ceramic components are preferably comprised of, but are not limited to: alumina, titanium carbide, silica ($SiO_2$), silicon nitride ($Si_3N_4$). glass (including quartz, soda lime or borosilicate), silicates, oxides, carbides, nitrides and borides of the transition elements, or partially or totally ceramic multiphase composites.

The present invention may also be used to fabricate and package microsystems and nanosystems.

Figure 1:
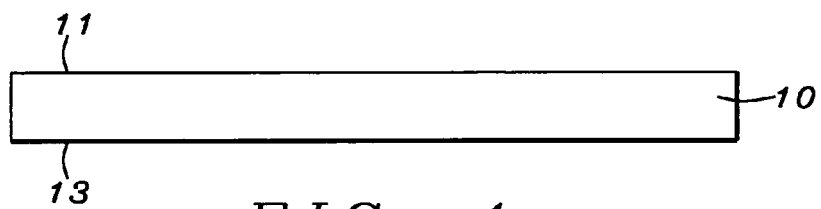
FIGS. 1 to 7 schematically illustrate a preferred embodiment of the present invention.

Conditioning of the First Ceramic Component 10—FIG. 1

As shown in FIG. 1, a first ceramic component 10 is conditioned by first polishing its upper and/or lower surfaces 11, 13 to achieve a mirror finish.

The mirrored surfaces 11, 13 are then cleaned in an organic or inorganic cleansing solvent. The cleansing solvent is preferably nitric acid, piranha (solution), ammonium hydrogen peroxide, RCA cleansing or acetone.

Figure 2:

Deposition of First Transition Layer 12, First Conductive Layer 14 and Intermediate Film 16—FIG. 2

The first ceramic component 10 is then placed within a deposition chamber and a first transition layer 12 is deposited upon upper surface 11 to a thickness of preferably from about 10 nm to 5 µm. Single or multiple transition layers 12 for the promotion of adhesion, are applied on the to-be bonded surface 11.

Typically, the transition layer 12 is deposited by physical vapor deposition methods or chemical vapor deposition methods. The gradient transition layer 12 will be arranged as follows: the structure and composition of the first layer deposited on the ceramic component are as similar as those of the ceramic components, then gradually changed to be as similar as those of the final conductive layer composed of semiconductive or conductive material. The thickness of the total transition layer ranges from nanometers to micrometers.

EXAMPLE 1

If the ceramic component is alumina ($Al_2O_3$), the composition and the structure of the gradient transition layer will be $Al_xO_y$. The element ratio y:x should be as close as 3:2 for the first layer deposited on the alumina ceramic component, followed by layers with y:x ratio less than 3:2, and gradually y:x ratio is reduced to 0.

EXAMPLE 2

If the ceramic component is titanium carbide (TiC), the composition and the structure of the gradient transition layer will be $Ti_xC_y$. The element ratio y:x should be as close as 1:1 for the first layer deposited on the titanium carbide ceramic component, followed by layers with y:x ratio less than 1:1, and gradually y:x ratio is reduced to 0.

EXAMPLE 3

If the ceramic component is silica ($SiO_2$) or silicon nitride ($Si_3N_4$), the transition layer can be Ti, TiW, or other materials which have less lattice mismatch with the silica or silicon nitride component than the final conductive or semiconductive layer.

If the adhesion is not so critical, such multiple transition layers are neglected. The conductive layers can be directly deposited on the to-be bonded surfaces. Alternatively, just one single transition layer is used.

It is noted that the transition layer composition and type will change with the to-be-bonded ceramics. There are several thousands of ceramics, therefore it's impossible to give out all the ceramics and needed transition layer compositions and types. We can only provide the guideline how to select transition layer compositions and types.

A first conductive layer 14 is then deposited upon first transition layer 12 to a thickness of preferably from about 20 nm to 5 µm. First conductive layer 14 may be metallic or semiconductive and is preferably comprised of Al, Cr, W, Ni, Ti, or alloys thereof, or silicon (Si) and is preferably deposited by (1) physical vapor deposition (PVD) which includes ablation, evaporation, ion beam deposition or sputtering; or (2) chemical vapor deposition (CVD).

Then, intermediate film 16 is deposited upon first conductive layer 14 to a thickness of preferably from about 10 nm to 5 µm and more preferably from about 10 nm to 2 µm.

Intermediate film 16, with or without alkaline ions, is preferably deposited by dry or wet approaches, such as evaporation, sputtering or a sol gel technique.

If intermediate film 16 is sol gel, the sol gel coating methods may include spin-on, immersion or spraying and further, at least the upper surface 11 is pretreated in organic or inorganic solutions such as preferably nitric acid, piranha (solution), ammonium hydrogen peroxide, RCA cleansing or acetone to render at least the upper surface 11 hydrophilic prior to deposition.

The first ceramic component 10 is then dried or tempered at a temperature ranging from room temperature, i.e., e.g. about 25° C., up to the anodic bonding temperature of the first and second ceramic components 10, 18, for example from about 25 to 400° C.

Figure 3:
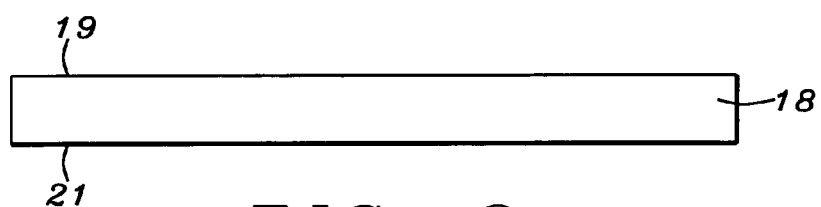

Conditioning of the Second Ceramic Component 18—FIG. 3

As shown in FIG. 3, a second ceramic component 18 is conditioned by preferably first polishing its lower and/or upper surfaces 21, 19 to achieve a mirror finish.

The mirrored surfaces 19, 21 are then cleaned in an organic or inorganic cleansing solvent. The cleansing solvent is preferably nitric acid, piranha (solution), ammonium hydrogen peroxide, RCA cleansing or acetone.

Figure 4:
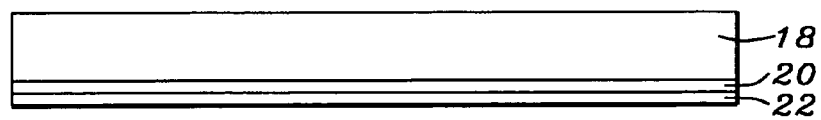

Deposition of Second Transition Film 20 and Second Conductive Layer 22—FIG. 4

The second ceramic component 18 is then placed within a deposition chamber and a second transition layer 20 is deposited upon lower surface 21 to a thickness of preferably from about 10 nm to 5 µm. Single or multiple transition layers 22 for the promotion of adhesion, are applied on the to-be bonded surface of both components. Typically, the transition layer 20 is deposited by physical vapor deposition methods or chemical vapor deposition methods. The gradient transition layer 20 will be arranged as follows: the structure and composition of the first layer deposited on the ceramic component are as similar as those of the ceramic components, then gradually change to be as similar as those of the final conductive layer composed of semiconductive or conductive material. The thickness of the total transition layer ranges from nanometers to micrometers.

If the adhesion is not so critical, such multiple transition layers are neglected. The conductive layers can be directly deposited on the to-be bonded surfaces. Alternatively, just one single transition layer may be used.

A second conductive layer 22 is then deposited upon second transition layer 20 to a thickness of preferably from about 20 nm to 5 µm. Second conductive layer 22 may be metallic or semiconductive and is preferably comprised of Al, Cr, W, Ni, Ti, or alloys thereof, or silicon (Si) and is preferably deposited by (1) physical vapor deposition (PVD) which includes ablation, evaporation, ion beam deposition or sputtering; or (2) chemical vapor deposition (CVD).

Cleansing of One or Both of the First and Second Ceramic Components 10, 18

Before bonding of the first and second ceramic components 10, 18 having their respective layers/films 12, 14, 16; 20, 22 formed thereover, one or both of them 10, 18 are cleansed:

in a cleansing solution preferably comprised of organic, sulfuric- or hydrogen-peroxide-based RCA solutions; at a temperature of preferably from about 50 to 90° C.;

for preferably from about 5 to 10 minutes; to render the cleansed ceramic component(s) 10, 18 hydrophilic.

Figure 5:
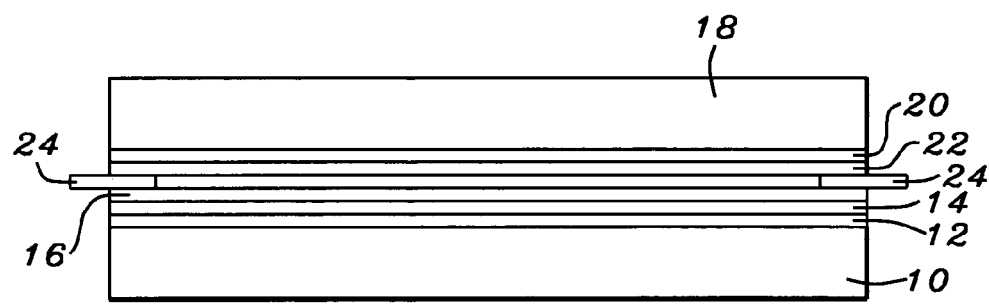

Alignment of First and Second Ceramic Components 10, 18—FIG. 5

As shown in FIG. 5 and at room temperature, i.e. at about 25° C., the second ceramic component 18 is then aligned with and placed on top of, and spaced apart from using spacers 24, the first ceramic component 10 so that the second conductive layer 22 on the second ceramic component 18 opposes the intermediate film 16 on the first ceramic component 10.

Spacers 24 have a thickness of preferably from about 20 to 50 μm and are placed at the edges of the first and second ceramic components 10, 18.

The stacked, spaced and aligned first and second ceramic components 10, 18 are placed into a vacuum chamber.

Figure 6:
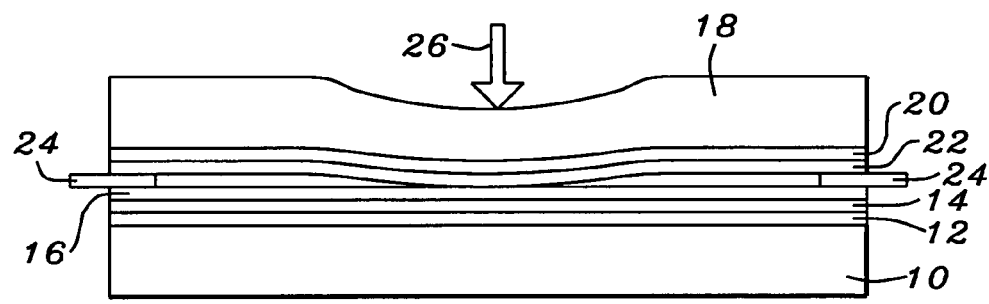

Bringing The First and Second Ceramic Components 10, 18 into Point Contact—FIG. 6

During vacuuming, the first and second ceramic components 10, 18 are heated to, and maintained at, a temperature of preferably from about 100 and 400° C. and more preferably from about 300 to 200° C. or less.

As shown in FIG. 6, with spacers 24 still in place, the center portions of the first and second ceramic components 10, 18 are brought into contact under pressure 26 of preferably from about 0.001 to 100 N/m$^2$.

Figure 7:
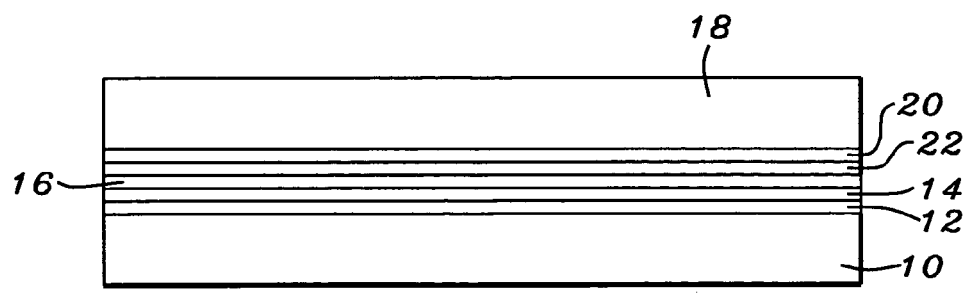

Removal of Spacers 24 and Anodic Bonding of the First and Second Ceramic Components 10, 18—FIG. 7

As shown in FIG. 7, spacers 24 are removed and the first and second ceramic components 10, 18 are anodically bonded at voltages of preferably from about 0 to 100 volts. The anodic bonding process is accomplished by pressing the first and second ceramic components 10, 18 together at one point from which the component 10, 18 contact wave proceeds to completion to form the bonded components 30. Initially, two components contact at one point, and when the spacers are pulled out, the contact area will extend from point contact to full wafer (in order to achieve hermetic or vacuum sealing).

The bonded components 30 have an excellent bond strength and can undergo further harsh processes or be employed in adverse operating environments.

As one skilled in the art would understand, three or more ceramic components may be bonded employing the method and teachings of the present invention either simultaneously or sequentially.

It is noted that if adhesion is not critical, multiple transition layers 12, 20 are not essential and only one transition layer 12, 20 need be used, or no transition layers 12, 20 need be used, with the conductive layer(s) 14, 22 being directly deposited upon the first and/or second ceramic component 10, 18 not having the transition layer 12, 20.

It is noted that silicon layers and/or semiconductors may be used as the second (ceramic) component 18. In this case, the conductive film on the second component is not necessary. The inventors have achieved the following successful specific cases of bonding in accordance with the teachings of the present invention, for example:

glass/silicon (Si) low temperature bonding (less than about 300° C.);

glass/glass low temperature bonding (less than about 300° C.);

Si/Si low temperature bonding (less than about 300° C.);

ceramic/ceramic low temperature bonding (less than about 300° C.); and combinations of the above materials with low temperature bonding (less than about 300° C.).

The semiconductors may be Si (as noted above), GaAs, InP or SiGe. Glass may be quartz, soda lime or borosilicate.

Further, as noted above, microsystems and nanosystems may be fabricated and packaged in accordance with the teachings of the present invention.

The applications for the present invention may include:

micro electromechanical systems (MEMS);
bio-MEMS and microfluidic devices;
micro-opto-electro-mechanical system (MOEMS);
substrate fabrication;
semiconductors;
microelectronics;
optoelectronics; and
hermetic and vacuum sealing.

The commercialization potentials of the present invention may include:

wafer level MEMS packaging (RF, sensors, actuators et al.);
bio-MEMS (Si and glass systems) and microfluidic devices;
wafer level MOEMS packaging;
multilayer inorganic substrates;
semiconductor-on-insulator, CMOS;
3D integrated circuits (ID); and
optoelectronics: OEIC.

Advantages of the Present Invention

The advantages of one or more embodiments of the present invention include:

1. a significantly reduced bonding temperature (preferably from about 100 to 400° C. and more preferably from about 300 to 200° C. or lower);
2. the ability to bond similar or different ceramic materials;
3. degradation and damage of pre-fabricated devices and integrated circuitry is avoided;
4. bonding-induced stress problems are reduced;
5. the bonding method is suitable for high-temperature applications;
6. reduced process cost;
7. high bonding quality;
8. the ability to bond semiconductors, glasses and ceramics; and
9. low residual stress and warpage.

While particular embodiments of the present invention have been illustrated and described, it is not intended to limit the invention, except as defined by the following claims.

We claim:

1. A method of bonding components, comprising the steps of:

providing at least a first ceramic component and a second ceramic component, each of the at least first and second ceramic components having an upper and lower surface;

forming a first conductive layer over the upper surface of the first component;

forming an intermediate film over the first conductive layer;

forming a second conductive layer over the lower surface of the second ceramic component;

then stacking the second ceramic component over the first ceramic component wherein the second conductive layer on the second ceramic component opposes the intermediate film on the first ceramic component; and anodically bonding together the first and second ceramic components wherein at least one transition layer is formed upon at least one of the first and second ceramic components.

2. The method of claim 1, including the step of:
polishing the upper and lower surfaces of the at least the first and second components,
before formation of the at least one transition layer.

3. The method of claim 1, including the step of:
cleansing the upper and lower surfaces of the at least first and second components,
before formation of the at least one transition layer.

4. The method of claim 1, including the steps of:
polishing the upper and lower surfaces of the at least the first and second components; and
cleansing the polished upper and lower surfaces of the at least first and second components,
before formation of the at least one transition layer.

5. The method of claim 1, including the step of:
drying the first ceramic component,
after formation of the second conductive layer and before the stacking of the first ceramic component and the second ceramic component.

6. The method of claim 1, including the step of:
cleansing at least one of the first and second ceramic components, after formation of the second conductive layer and before the stacking of the first ceramic component and the second ceramic component.

7. The method of claim 1, including the steps of:
drying the first ceramic component; and
then cleansing at least one of the first and second ceramic components, after formation of the second conductive layer and before the stacking of the first ceramic component and the second ceramic component.

8. The method of claim 1, wherein the first and second ceramic components are anodically bonded together at a temperature of from about 100 to 400° C.

9. A method of bonding components, comprising the steps of:
providing at least a first ceramic component and a second component; the at least first ceramic component and the second component each having an upper and lower surface, the second component being comprised of a silicon layer or a semiconductor layer;
forming a conductive layer over the upper surface of the first ceramic component;
forming an intermediate film over the conductive layer;
then stacking the second component over the first ceramic component wherein the upper or lower surface of the second component opposes the intermediate film on the first ceramic component; and
anodically bonding together the at least a first ceramic component and the second component; wherein at least one transition layer is formed upon at least one of the at least a first ceramic component and the second component, the at least one transition layer is comprised of $Al_xO_y$, $Ti_xC_y$, Ti or TiW.

10. The method of claim 1, wherein at least one transition layer is formed upon at least one of the first and second ceramic components; the at least one transition layer is comprised of $Al_xO_y$, $Ti_xC_y$, Ti or TiW.

11. The method of claim 1, wherein at least one respective transition layer is formed upon both the first and second ceramic components.

12. The method of claim 1, wherein at least one respective transition layer is formed upon both the first and second ceramic components; the at least one transition layer is comprised of $Al_xO_y$, $Ti_xC_y$, Ti or TiW.

13. The method of claim 1, wherein the first and second stacked ceramic components are spaced apart using spacers before bonding.

14. The method of claim 1, wherein the first and second ceramic components are comprised of:
glass;
silicates;
oxides;
carbides, nitrides and borides of the transition elements; or
multiphase composites which may be totally or partially ceramic.

15. The method of claim 1, wherein the first and second ceramic components are comprised of:
quartz;
silicates;
oxides;
carbides, nitrides and borides of the transition elements; or
multiphase composites which may be totally or partially ceramic.

16. The method of claim 1, wherein the first and second ceramic components are comprised of:
alumina;
titanium carbide;
silica ($SiO_2$);
silicon nitride ($Si_3N_4$);
soda lime; or
borosilicate.

17. The method of claim 1, wherein the first and second ceramic components are each comprised of the same material.

18. The method of claim 1, wherein the first and second ceramic components are comprised of a different material.

19. The method of claim 1, wherein the first and second conductive layers are metallic or semiconductive.

20. The method of claim 1, wherein the first and second conductive layers are comprised of Al, Cr, W, Ni, Ti, or alloys thereof, or silicon.

21. The method of claim 1, wherein the first conductive layer has a thickness of from about 20 nm to 5 μm; and the second conductive layer has a thickness of from about 20 nm to 5 μm.

22. The method of claim 1, wherein the intermediate film has a thickness of from about 10 nm to 5 μm.

23. The method of claim 1, including the step of:
drying the first ceramic component,
after formation of the second conductive layer and before the stacking of the first ceramic component and the second ceramic component; wherein the first ceramic component is dried at from about 25 to 400° C.

24. The method of claim 1, including the step of:
cleansing at least one of the first and second ceramic components,
after formation of the second conductive layer and before the stacking of the first ceramic component and the second ceramic component; wherein the cleansing of the at least one of the first and second ceramic components renders the at least one of the first and second ceramic components hydrophilic.

25. The method of claim 1, wherein the first and second ceramic components are anodically bonded together at a temperature of from about 300 to 200° C.

26. The method of claim 1, wherein the first and second ceramic components are bonded together at a temperature of less than about 200° C.

27. The method of claim 1, wherein the method is employed in:
micro electromechanical systems (MEMS);
bio-MEMS and microfluidic devices;
micro-opto-electro-mechanical system (MOEMS);
substrate fabrication;
semiconductors;
microelectronics;
optoelectronics; or
hermetic and vacuum sealing.

28. The method of claim 1, wherein the method is employed in:
wafer level MEMS packaging (RF, sensors, actuators et al.);
bio-MEMS (Si and glass systems) and microfluidic devices;
wafer level MOEMS packaging;
multilayer inorganic substrates;
semiconductor-on-insulator, CMOS;
3D integrated circuits (ID); or
optoelectronics: OEIC.

29. The method of claim 1, wherein the intermediate film includes alkaline ions or does not include alkaline ions.

30. A method of bonding components, comprising the steps of:
providing at least a first ceramic component and a second ceramic component, each of the at least first and second ceramic components having an upper and lower surface;
polishing the upper and lower surfaces of the at least the first and second ceramic components;
cleansing the polished upper and lower surfaces of the at least first and second ceramic components;
forming a first conductive layer over the cleansed upper surface of the first ceramic component;
forming an intermediate film over the first conductive layer;
forming a second conductive layer over the cleansed lower surface of the second ceramic component;
then drying the first ceramic component;
then cleansing at least one of the first and second ceramic components;
then stacking the second ceramic component over the first ceramic component wherein the second conductive layer on the second ceramic component opposes the intermediate film on the first ceramic component; and
anodically bonding together the first and second ceramic components at a temperature of from about 100 to 400° C.; wherein at least one transition layer is formed upon at least one of the first and second ceramic components.

31. The method of claim 30, wherein the at least one transition layer is comprised of $Al_xO_y$, $Ti_xC_y$, Ti or TiW.

32. The method of claim 30, wherein at least one respective transition layer is formed upon both the first and second ceramic components.

33. The method of claim 30, wherein the first and second stacked ceramic components are spaced apart using spacers before bonding.

34. The method of claim 30, wherein the first and second ceramic components are comprised of:
glass;
silicates;
oxides;
carbides, nitrides and borides of the transition elements; or
multiphase composites which may be totally or partially ceramic.

35. The method of claim 30, wherein the first and second ceramic components are comprised of:
quartz;
silicates;
oxides of;
carbides, nitrides and borides of the transition elements; or
multiphase composites which may be totally or partially ceramic.

36. The method of claim 30, wherein the first and second ceramic components are comprised of:
alumina;
titanium carbide;
silica ($SiO_2$);
silicon nitride ($Si_3N_4$);
soda lime; or
borosilicate.

37. The method of claim 30, wherein the first and second ceramic components are each comprised of the same material.

38. The method of claim 30, wherein the first and second ceramic components are comprised of a different material.

39. The method of claim 30, wherein the first and second conductive layers are metallic or semiconductive.

40. The method of claim 30, wherein the first and second conductive layers are comprised of Al, Cr, W, Ni, Ti, or alloys thereof, or silicon.

41. The method of claim 30, wherein the first conductive layer has a thickness of from about 20 nm to 5 μm; and the second conductive layer has a thickness of from about 20 nm to 5 μm.

42. The method of claim 30, wherein the intermediate film has a thickness of from about 10 nm to 5 μm.

43. The method of claim 30, wherein the first ceramic component is dried at from about 25 to 400° C.

44. The method of claim 30, wherein the cleansing of the at least one of the first and second ceramic components renders the at least one of the first and second ceramic components hydrophilic.

45. The method of claim 30, wherein the first and second ceramic components are bonded together at a temperature of from about 300 to 200° C.

46. The method of claim 30, wherein the first and second ceramic components are bonded together at a temperature of less than about 200° C.

47. The method of claim 30, wherein the method is employed in:
micro electromechanical systems (MEMS);
bio-MEMS and microfluidic devices;
micro-opto-electro-mechanical system (MOEMS);
substrate fabrication;
semiconductors;
microelectronics;
optoelectronics; or
hermetic and vacuum sealing.

48. The method of claim 30, wherein the method is employed in:
  wafer level MEMS packaging (RF, sensors, actuators et al.);
  bio-MEMS (Si and glass systems) and microfluidic devices;
  wafer level MOEMS packaging;
  multilayer inorganic substrates;
  semiconductor-on-insulator, CMOS;
  3D integrated circuits (ID); or
  optoelectronics: OEIC.

49. The method of claim 30, wherein the intermediate film includes alkaline ions or does not include alkaline ions.

50. A method of bonding ceramic components, comprising the steps of:
  providing at least a first ceramic component and a second ceramic component, each of the at least first and second ceramic components having an upper and lower surface;
  polishing the upper and lower surfaces of the at least the first and second ceramic components;
  cleansing the polished upper and lower surfaces of the at least first and second ceramic components;
  forming a first transition layer over the cleansed upper surface of the first ceramic component;
  forming a first conductive layer over the first transition layer;
  forming an intermediate film over the first conductive layer; the intermediate film including alkaline ions or not including alkaline ions;
  forming a second transition layer over the cleansed lower surface of the second ceramic component;
  forming a second conductive layer over the second transition layer;
  then drying the first ceramic component;
  then cleansing at least one of the first and second ceramic components;
  then stacking the second ceramic component over the first ceramic component wherein the second conductive layer on the second ceramic component opposes the intermediate film on the first ceramic component; and
  anodically bonding together the first and second ceramic components at a temperature of from about 100 to 400° C.

51. The method of claim 50, wherein the first and second transition layers are comprised of $Al_xO_y$, $Ti_xC_y$, Ti or TiW.

52. The method of claim 50, wherein the first and second stacked ceramic components are spaced apart using spacers before bonding.

53. The method of claim 50, wherein the first and second ceramic components are comprised of:
  glass;
  silicates;
  oxides;
  carbides, nitrides and borides of the transition elements; or
  multiphase composites which may be totally or partially ceramic.

54. The method of claim 50, wherein the first and second ceramic components are comprised of:
  quartz;
  silicates;
  oxides;
  carbides, nitrides and borides of the transition elements; or
  multiphase composites which may be totally or partially ceramic.

55. The method of claim 50, wherein the first and second ceramic components are comprised of:
  alumina;
  titanium carbide;
  silica ($SiO_2$);
  silicon nitride ($Si_3N_4$);
  soda lime; or borosilicate.

56. The method of claim 50, wherein the first and second ceramic components are each comprised of the same material.

57. The method of claim 50, wherein the first and second ceramic components are comprised of a different material.

58. The method of claim 50, wherein the first and second conductive layers are metallic or semiconductive.

59. The method of claim 50, wherein the first and second conductive layers are comprised of Al, Cr, W, Ni, Ti, or alloys thereof, or silicon.

60. The method of claim 50, wherein the first conductive layer has a thickness of from about 20 nm to 5 µm; and the second conductive layer has a thickness of from about 20 nm to 5 µm.

61. The method of claim 50, wherein the intermediate film has a thickness of from about 10 nm to 5 µm.

62. The method of claim 50, wherein the first ceramic component is dried at from about 25 to 400° C.

63. The method of claim 50, wherein the cleansing of the at least one of the first and second ceramic components renders the at least one of the first and second ceramic components hydrophilic.

64. The method of claim 50, wherein the first and second ceramic components are bonded together at a temperature of from about 300 to 200° C.

65. The method of claim 50, wherein the first and second ceramic components are bonded together at a temperature of less than about 200° C.

66. The method of claim 50, wherein the method is employed in:
  micro electromechanical systems (MEMS);
  bio-MEMS and microfluidic devices;
  micro-opto-electro-mechanical system (MOEMS);
  substrate fabrication;
  semiconductors;
  microelectronics;
  optoelectronics; or
  hermetic and vacuum sealing.

67. The method of claim 50, wherein the method is employed in:
  wafer level MEMS packaging (RF, sensors, actuators et al.);
  bio-MEMS (Si and glass systems) and microfluidic devices;
  wafer level MOEMS packaging;
  multilayer inorganic substrates;
  semiconductor-on-insulator, CMOS;
  3D integrated circuits (ID); or
  optoelectronics: OEIC.

68. The method of claim 9, wherein the intermediate film includes alkaline ions or does not include alkaline ions.

69. The method of claim 9, including the step of:
  polishing the upper and lower surfaces of the at least a first ceramic component and the second component,
  before formation of the at least one transition layer.

70. The method of claim 9, including the step of:
  cleansing the upper and lower surfaces of the at least a first ceramic component and the second component,
  before formation of the at least one transition layer.

71. The method of claim 9, including the steps of:
polishing the upper and lower surfaces of the at least a first ceramic component and the second component; and
cleansing the polished upper and lower surfaces of the at least a first ceramic component and the second component,
before formation of the at least one transition layer.

72. The method of claim 9, including the step of:
drying the first ceramic component,
after formation of the intermediate film and before the stacking of the at least a first ceramic component and the second component.

73. The method of claim 9, including the step of:
cleansing at least one of the at least a first ceramic component and the second component,
after formation of the intermediate film and before the stacking of the at least a first ceramic component and the second component.

74. The method of claim 9, including the steps of:
drying the first ceramic component; and
then cleansing at least one of the at least a first ceramic component and the second component,
after formation of the intermediate film and before the stacking of the at least a first ceramic component and the second component.

75. The method of claim 9, wherein the at least a first ceramic component and the second component are anodically bonded together at a temperature of from about 100 to 400° C.

76. The method of claim 9, wherein at least one respective transition layer is formed upon both the at least a first ceramic component and the second component.

77. The method of claim 9, wherein at least one respective transition layer is formed upon both of the at least a first ceramic component and the second component.

78. The method of claim 9, wherein the at least a first ceramic component and the second component are spaced apart using spacers before bonding.

79. The method of claim 9, wherein the first ceramic component is comprised of:
glass;
silicates;
oxides;
carbides, nitrides and borides of the transition elements; or
0multiphase composites which may be totally or partially ceramic.

80. The method of claim 9, wherein the first ceramic component is comprised of:
quartz;
silicates;
oxides;
carbides, nitrides and borides of the transition elements; or
multiphase composites which may be totally or partially ceramic.

81. The method of claim 9, wherein the first ceramic component is comprised of:
alumina;
titanium carbide;
silica ($SiO_2$);
silicon nitride ($Si_3N_4$);
soda lime; or
borosilicate.

82. The method of claim 9 wherein the first ceramic component is glass.

83. The method of claim 9, wherein the conductive layer is metallic or semiconductive.

84. The method of claim 9, wherein the conductive layer is comprised of Al, Cr, W, Ni, Ti, or alloys thereof, or silicon.

85. The method of claim 9, wherein the conductive layer has a thickness of from about 20 nm to 5 µm.

86. The method of claim 9, wherein the intermediate film has a thickness of from about 10 nm to 5 µm.

87. The method of claim 9, including the step of:
drying the first ceramic component,
after formation of the intermediate film and before the stacking of the at least a first ceramic component and a second component; wherein the first ceramic component is dried at from about 25 to 400° C.

88. The method of claim 9, including the step of:
cleansing at least one of the at least a first ceramic component and a second component,
after formation of the intermediate film and before the stacking of the at least a first ceramic component and a second component; wherein the cleansing of the at least one of the at least a first ceramic component and a second component renders the at least one of the at least a first ceramic component and a second component hydrophilic.

89. The method of claim 9, wherein the at least a first ceramic component and a second component are anodically bonded together at a temperature of from about 300 to 200° C.

90. The method of claim 9, wherein the at least a first ceramic component and a second component are bonded together at a temperature of less than about 200° C.

* * * * *